United States Patent [19]
Glass et al.

[11] Patent Number: 5,488,232
[45] Date of Patent: Jan. 30, 1996

[54] ORIENTED DIAMOND FILM STRUCTURES ON NON-DIAMOND SUBSTRATES

[75] Inventors: Jeffrey T. Glass, Apex; Denise T. Simendinger; Peter T. Goeller, both of Raleigh, all of N.C.

[73] Assignee: North Carolina State University, Raleigh, N.C.

[21] Appl. No.: 128,365

[22] Filed: Sep. 28, 1993

[51] Int. Cl.⁶ .................... H01L 29/161; H01L 29/20; H01L 29/22
[52] U.S. Cl. .................................... 257/77; 257/613
[58] Field of Search ............................ 257/77, 613

[56] References Cited

U.S. PATENT DOCUMENTS

| | | |
|---|---|---|
| 4,062,660 | 12/1977 | Nicholas et al. |
| 5,075,094 | 12/1991 | Morrish et al. |
| 5,082,359 | 1/1992 | Kirkpatrick. |
| 5,082,522 | 1/1992 | Purdes et al. |
| 5,155,559 | 10/1992 | Humphreys et al. |
| 5,202,273 | 4/1993 | Nakamura ............... 437/40 |
| 5,212,401 | 5/1993 | Humphreys et al. |
| 5,272,104 | 12/1993 | Schrantz et al. ............ 437/63 |
| 5,323,022 | 6/1994 | Glass et al. ................ 257/77 |
| 5,377,139 | 12/1994 | Lage et al. ................ 257/277 |

FOREIGN PATENT DOCUMENTS

| | | |
|---|---|---|
| 0421397A1 | 4/1991 | European Pat. Off. |
| 2054768 | 2/1990 | Japan. |
| 2-243598 | 9/1990 | Japan. |
| 4-132687 | 5/1992 | Japan. |
| WO89/11897 | 12/1989 | WIPO. |
| WO93/02471 | 2/1993 | WIPO. |

OTHER PUBLICATIONS

Bovenkerk et al., "Preparation of Diamond", Nature, pp. 1094–1098, Oct. 10, 1959.
Sato et al., "Epitaxial Growth of Diamond from the Gas Phase", New Diamond Science and Technology, 1987 MRS Int. Conf. Proc., pp. 371–376.
R. H. Wentorf, Jr., "Diamond Synthesis", General Electric Research Laboratory, Schenectady, New York.
Chen et al., Effect of the Chemical Nature of Transition–Metal Substrates on Chemical–Vapor Deposition of Diamond, J. Appl. Phys. 74 (6):4168, (1993).
Singh et al., Microstructural Evolution of Diamond Growth on Iron Silicide/Silicon Substrates by Hot Filament Chemical Vapor Deposition, Surface and Coatings Technologies 64 (3):131 (1994).
V. I. Klykov et al., "Diataxial Growth of Silicon and Germanium", Journal of Crystal Growth 52 (1981) 687–691.
D. S. Olson et al., "Growth of Diamond From Sputtered Atomic Carbon and Atomic Hydrogen", Mat. Res. Soc. Symp. Proc. vol. 270.

Primary Examiner—Ngân V. Ngô
Attorney, Agent, or Firm—Bell, Seltzer, Park & Gibson

[57] ABSTRACT

The present invention provides a semiconductor device comprising a first layer of a metal silicide and a second layer on the first metal silicide layer; the second layer comprising a semiconducting diamond film. The present invention also provides a method for making a semiconductor device comprising the steps of providing a layer of a transition metal silicide and forming a semiconducting diamond layer on the layer of transition metal silicide.

15 Claims, 4 Drawing Sheets

ORIENTED DIAMOND FILM STRUCTURES ON NON-DIAMOND SUBSTRATES

The inventors acknowledge that they were partially supported by funds administered by the Office of Naval Research under Contracts Nos. 00014-91-J-1416 and 00014-90-J-1873. The Office of Naval Research may have certain rights in the application.

BACKGROUND AND FIELD OF THE INVENTION

The invention relates to a diamond films on a metal substrate, such as for microelectronics applications, and a method for providing the same.

Diamond is a preferred material for semiconductor devices because it has semiconductor properties that are better than traditionally used silicon (Si), germanium (Ge) or gallium arsenide (GaAs). Diamond provides a higher energy band gap, a higher breakdown voltage and a greater saturation velocity than these traditional semiconductor materials.

These properties of diamond yield a substantial increase in projected cutoff frequency and maximum operating voltage compared to devices fabricated using Si, Ge, or GaAs. Si is typically not used at temperatures higher than about 200° C. and GaAs is not typically used above 300° C. These temperature limitations are caused, in part, because of the relatively small energy band gaps for Si (1.12 eV at ambient temperature) and GaAs (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces it degradation in radioactive environments, i.e., diamond is a "radiation-hard" material.

Because of the advantages of diamond as a material for semiconductor devices, there is at present an interest in the growth and use of diamond for high temperature and radiation-hardened electronic devices. In particular, there is a present interest in the growth and use of single crystal diamond as a material for semiconductor devices. This interest is due in part to the increased efficiency of operation of single crystal semiconducting diamond in comparison with polycrystalline semiconducting diamond in which grain boundaries may impede the flow of charge carriers within the device.

Unfortunately, the fabrication of a single crystal diamond film is typically carried out by homoepitaxial deposition of a semiconducting diamond film on a single crystal diamond substrate. Such a single crystal diamond substrate is relatively expensive. Thus, the heteroepitaxial growth of single crystal diamond thin films on nondiamond substrates by chemical vapor deposition (CVD) has long been sought due to its enormous potential impact on the microelectronics industry.

Promising candidate substrate materials for the heteroepitaxial growth of diamond include cBN, β-SiC, BeO, Ni, Cu, Si, and a few refractory metals such as Ta, W and Mo. Nickel is one of the few materials that has a relatively close lattice match with diamond (a=3.52Å for Ni and a=3.56Å for diamond). However, apart from reports of heteroepitaxial growth of diamond films on cBN and β-SiC substrates and some limited success of growing some diamond particles oriented on nickel substrates, most experiments have yielded randomly oriented, three-dimensional diamond nuclei which are not suitable for forming a single crystal diamond film as is desirable for semiconductor applications. It is believed that the extremely high surface energy of diamond (in the range of 5.3–9.2 $J/m^2$ for the principal low index planes) and the existence of extensive interfacial misfit and strain energies between diamond films and nondiamond substrates may be the primary obstacles in forming oriented two-dimensional diamond nuclei.

It has been known for decades that nickel is an effective catalyst metal for diamond crystallization under high pressure and high temperature (HPHT) conditions. See, for example, Preparation of Diamond by Bovenkerk et al., Nature, pp. 1094–1098, Oct. 10, 1959. Although a detailed mechanism of the catalytic effect has not been completely developed, it is believed that its strong reactivity with carbon is essential in the catalytic HPHT diamond growth process. However, high solubility of nickel for carbon and its strong catalytic effect on hydrocarbon decomposition and subsequent graphite formation at low pressures have prevented CVD diamond nucleation on its surface without the deposition of an intermediate graphite layer. A graphite interlayer generally forms immediately when nickel substrates are placed in a methane-hydrogen CVD environment. This has precluded the possible development of an oriented relationship between the diamond film and the nickel substrate, even though diamond might eventually nucleate and grow on the graphite interlayer. The graphite interlayer also prevents good mechanical adhesion to the underlying substrate.

Sato et al. in an article entitled *Epitaxial Growth of Diamond from the Gas Phase*, New Diamond Science and Technology, 1987 MRS Int. Conf. Proc., pp. 371–376, discloses some epitaxial diamond growth on a nickel substrate starting with a mechanical surface preparation using a diamond powder to abrade the nickel substrate surface to increase nucleation density. Nucleation density was reported to be highest for a CVD temperature in the range of 800°–900° C. during diamond deposition, although deposition was carried out in the temperature range of 500°–1000° C. Sato et al. disclose that the methane concentration must be kept below a critical value at a given substrate temperature in an attempt to suppress graphite formation.

SUMMARY OF THE INVENTION

In view of the foregoing background, it is therefore an object of the present invention to provide a method for forming a diamond film, preferably oriented diamond film on a substrate, particularly to enable the growth of a single crystal diamond film on the substrate.

It is another object of the present invention to provide a method for forming a diamond film on a metal substrate using CVD techniques while avoiding graphitization and random diamond nucleation, and while forming a strong adhesion between the substrate and the thus formed diamond film.

These and other objects according to the present invention are provided by a semiconductor device comprising a diamond film or layer, preferably an oriented diamond film and a metal silicide layer adjacent to the diamond film or layer.

In another embodiment, the present invention provides a semiconductor device comprising a single crystal diamond film, a substrate adjacent to the diamond film and a transition metal silicide layer interface region between the diamond film and the substrate. The substrate is a non-diamond substrate such as transition metal or a conventional semiconductor device substrate.

It is theorized that the unfilled d shell electrons of transition metals like nickel tend to react with silicon filling those orbitals which catalyze graphitization. The silicon then provides atoms which want to form tetrahedral bonds with carbon thereby facilitating diamond formation. The transition metal is preferably selected from the group consisting of nickel, cobalt, copper, chromium, magnesium, zinc, iron, and alloys thereof. The transition metals typically have a relatively close lattice match to diamond.

By "oriented diamond film" is meant that the individual diamond crystals are in alignment with the lattice of corresponding portions of the non-diamond substrate. If the diamond crystals and the transition metal silicide are in alignment, the oriented diamond crystal may be further grown into a single crystal diamond film or layer.

The present invention also provides a method for making a semiconductor device comprising the steps of providing a transition metal silicide layer, and depositing a diamond film on the transition metal silicide layer. The step of depositing the diamond onto the substrate preferably includes CVD by exposing the substrate to a carbon and hydrogen containing gas mixture, such as a methane and hydrogen gas mixture, while the substrate is maintained at a predetermined temperature. The methane and hydrogen gas mixture, for example, preferably includes a methane concentration in the range of about 0.1 to 1.5% by mass, and more preferably no more than about 0.5% methane by mass. In addition, the CVD deposition of diamond may be carried out at conventional CVD pressures, such as in the range of about 10 to 150 Torr.

DETAILED DESCRIPTION OF THE PREFERRED EMBODIMENTS

Figure 1:
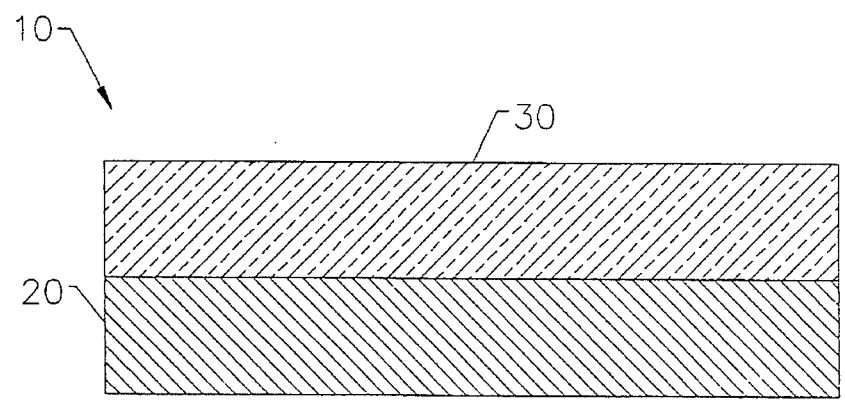
FIG. 1 is a cross-sectional side elevational view of a semiconductor device according to the present invention.

The present invention will now be described more fully hereinafter with reference to the accompanying drawings, in which preferred embodiments of the inventions are shown. This invention may, however, be embodied in many different forms and should not be construed as limited to the embodiments set forth herein. Rather, Applicants provide these embodiments so that this disclosure will be thorough and complete, and will fully convey the scope of the invention to those skilled in the art. In the drawings, the thickness of layers and regions are exaggerated for clarity.

Figure 2:
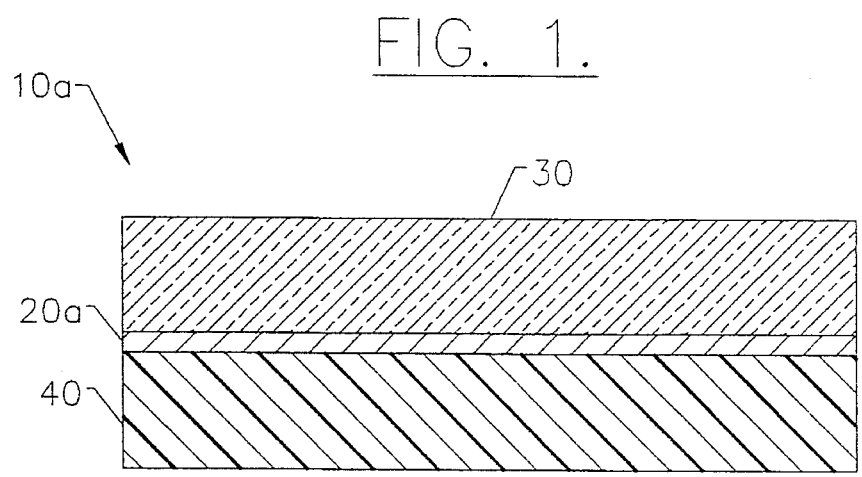
FIG. 2 is a cross-sectional side elevational view of another semiconductor device according to the present invention.
Figure 3:
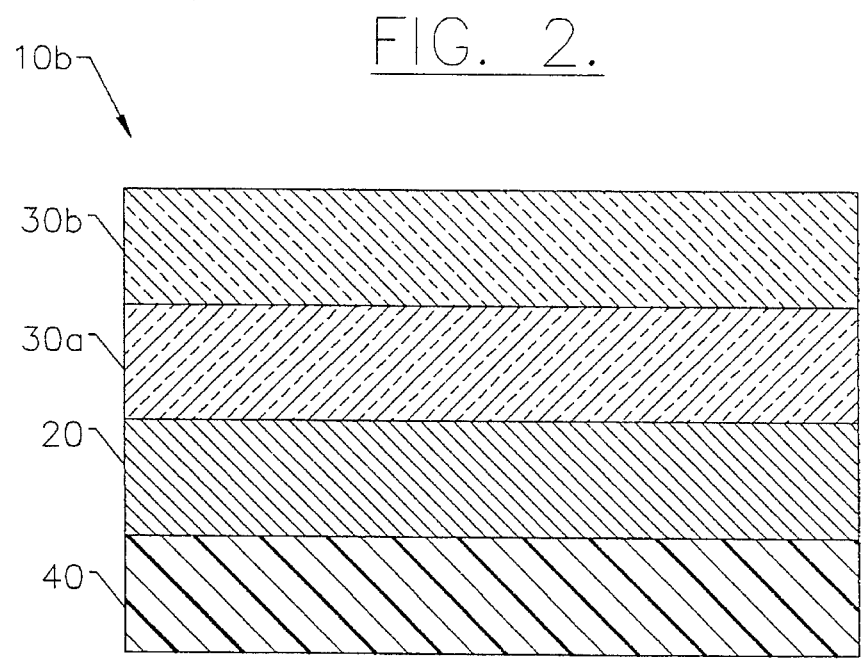
FIG. 3 is a cross-sectional side elevational view of yet another semiconductor device according to the present invention.

Referring to FIG. 1 there is shown a semiconductor device 10 according to the present invention. The semiconductor device 10 comprises a first metal silicide layer 20 and a second semiconducting diamond film or layer 30. FIG. 2 illustrates an embodiment wherein the device 10 comprises a semiconducting diamond film or layer 30, a substrate 40 adjacent the diamond layer 30 and a transition metal silicide interface region 20a between the diamond layer 30 and the substrate 40. FIG. 3 illustrates an embodiment wherein an insulating diamond layer 30a is grown on a metal silicide layer 20 on a substrate 40. A conducting diamond layer 30b can then be deposited or grown on the insulating diamond layer.

The semiconducting diamond layer 30 may have a thickness of greater than about 20Å, preferably between about 100Å and about 2 μm. The semiconducting oriented diamond is preferably a heteroepitaxial single crystal diamond film, although the present invention includes the deposition of highly oriented or polycrystalline diamond.

The diamond layer 30 is formed or deposited on the metal silicide layer using conventional gas phase techniques such as CVD by exposing a bulk transition metal silicide 20 or a transition metal silicide on a substrate 40 to a carbon and hydrogen containing gas mixture, such as a methane and hydrogen gas mixture, while the substrate is maintained at a predetermined temperature. The methane and hydrogen gas mixture, for example, preferably includes a methane concentration in the range of about 0.1 to 1.5% by mass, and more preferably no more than about 0.5% methane by mass. As would be readily understood by those skilled in the art, other gas mixtures for CVD formation of diamond may be readily used. In addition, the CVD deposition of diamond may be carried out at conventional CVD pressures, such as in the range of about 10 to 150 Torr.

The metal silicide layer 20 preferably is a transition metal silicide. The transition metal is selected from the group consisting of nickel, cobalt, copper, chromium, magnesium, iron, zinc and alloys thereof. Suitable alloys are metals there can form homogeneous mixtures with the metal of the metal silicide. Exemplary alloy metals include gold, palladium, platinum and the like. The metal of the metal silicide layer can also be a refractory metal such as titanium, tantalum, tungsten, molybdenum, hafnium and niobium.

A preferred metal silicide is $Ni_3Si$. The metal silicide layer can be a bulk silicide layer or can be an interface between the diamond layer 30 and the non-diamond substrate 40. The metal silicide can be as thin as one monolayer. The metal silicide layer has a relatively close lattice match with diamond. By lattice matching, the layers are in atomic registry with each other, namely the crystal structures are substantially in alignment with each other. As described in U.S. Pat. No. 5,212,401 to Humphreys et al., the disclosure of which is incorporated herein by reference in its entirety, lattice match relates to the difference between the lattice constant ("$a_o$") of diamond and the metal, and is typically expressed in terms of a "lattice mismatch". Preferably the lattice mis-match is less than about 7 percent, preferably less than about 4 percent, and more preferably less than about 2 percent relative to the lattice constant of diamond. The lattice matching results in strong atomic bonding.

The non-diamond substrate 40 can be a transition metal selected from the group consisting of nickel, cobalt, copper, chromium, magnesium, iron, zinc, and alloys thereof which have a relatively close lattice match to diamond. Typically, the substrate 40 has a thickness of greater than about 10 μm, and preferably between about 500 μm to 10 mm.

Figure 4:
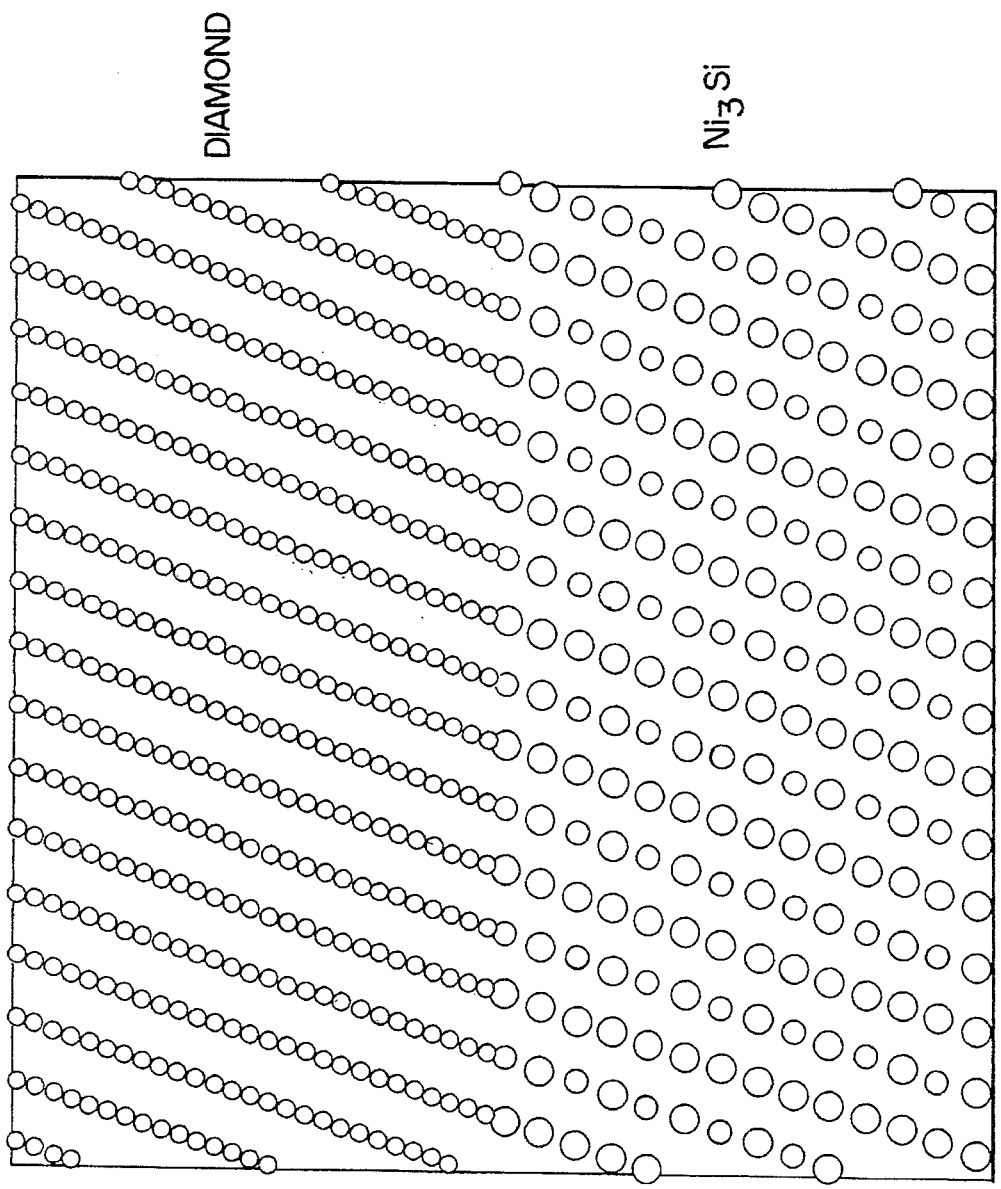
FIG. 4 is a schematic diagram of the two-dimensional device illustrating the interface between the diamond layer and the transition metal layer according to the present invention.

The non-diamond substrate can also be conventional non-diamond, semiconductor device-type substrate such as $Al_2O_3$, $MgO$, $SrTiO_3$, $ZrO_2$, $BeO$, $BaF_2$, $CaF_2$, $SiC$, $GaAs$, $AlN$, $SiO_2$, $Si$, $Si_3N_4$, $LaAlO_3$ and $LaGaO_3$. The combination of lattice matching and the transition metal silicide containing silicon which tends to form tetrahedral bonds with carbon results in strong bonding and good adhesion. The interface is shown in FIG. 4, noting the alternation of nickel and silicon atoms. In the past, nickel and similar metals would readily form graphite in a CVD process for growing diamond unless special thermal treatments are employed. The present invention overcomes this limitation.

The example which follows is provided to further illustrate the present invention and is not to be construed as limiting thereof.

EXAMPLE 1

A bulk nickel silicide ($Ni_3Si$) is prepared by an arc melting technique using stoichiometric amounts of nickel and silicon to result in the $Ni_3Si$ alloy. 2.2834 grams of elemental nickel in the form of 2.0 mm diameter wire (Johnson-Matthey, lot #17508) is weighed and added to 0.3375 grams of silicon lumps (Alfa, lot# m4N5), resulting in a total weight of 2.6207 grams. The nickel and silicon are placed into the are furnace. After arc melting, the sample is again weighed 2.6185 grams) and then annealed for 20 hours in a furnace at 1000° C. and $10^{-6}$ Torr. The resulting sample or a piece thereof is polished using the method:

| 5 minutes | 500 grit silicon carbide |
|---|---|
| 5 minutes | 30 μm diamond |
| 5 minutes | 6 μm diamond |
| 5 minutes | 1 μm diamond |
| 5 minutes | 0.3 μm alumina |
| 5 minutes | 0.05 μm alumina |

Diamond growth is achieved on the resulting $Ni_3Si$ substrate in a microwave plasma system (Astex, 1500 Watts) using the following parameters:

| initial pressure biasing conditions | 10 Torr |
|---|---|
| pressure | 15 Torr |
| $CH_4$ flow | 25 sccm |
| $H_2$ flow | 500 sccm |
| bias voltage | −250 VDC |
| microwave power | 900 Watts/20 reflected watts |
| time | 20 minutes |
| growth conditions | |
| pressure | 25 Torr |
| $CH_4$ flow | 2.5 sccm |
| $H_2$ flow | 500 sccm |
| microwave power | 900 Watts/20 reflected Watts |
| time | 24 hours |

Figure 5A:
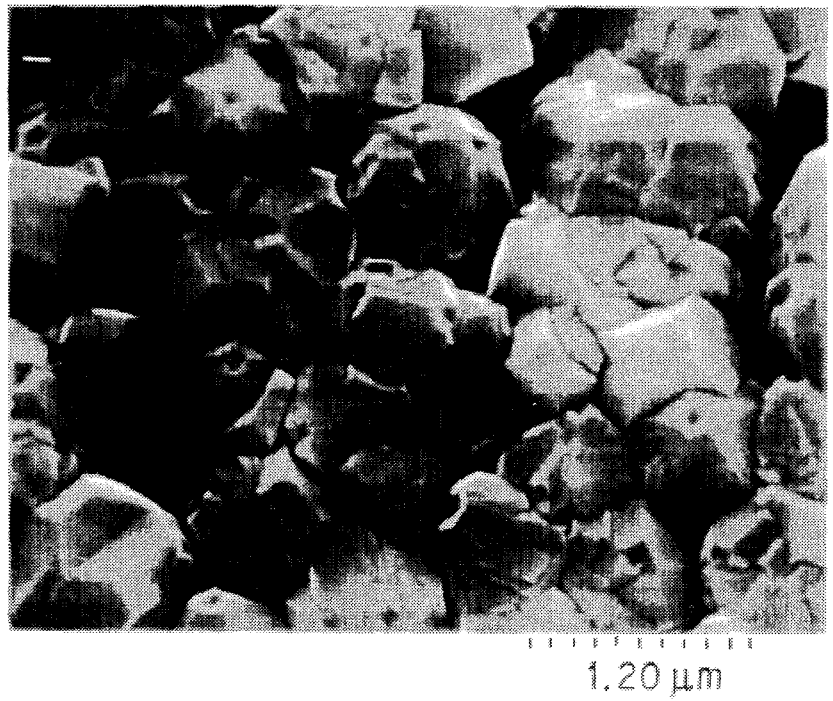
FIG. 5A and 5B are SEM micrographs of diamond formed on a $Ni_3Si$ substrate as described in the Example.
Figure 5B:
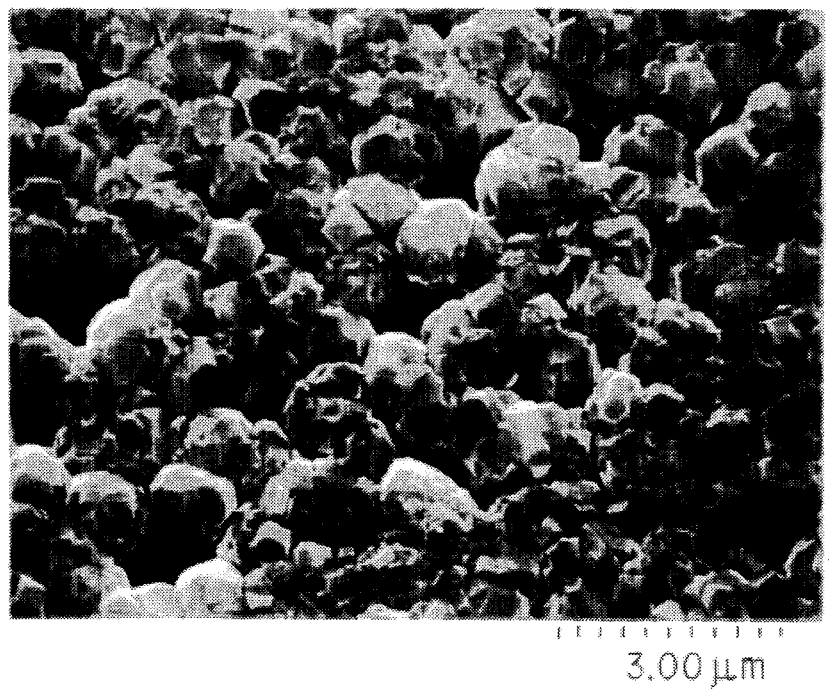
Figure 6:
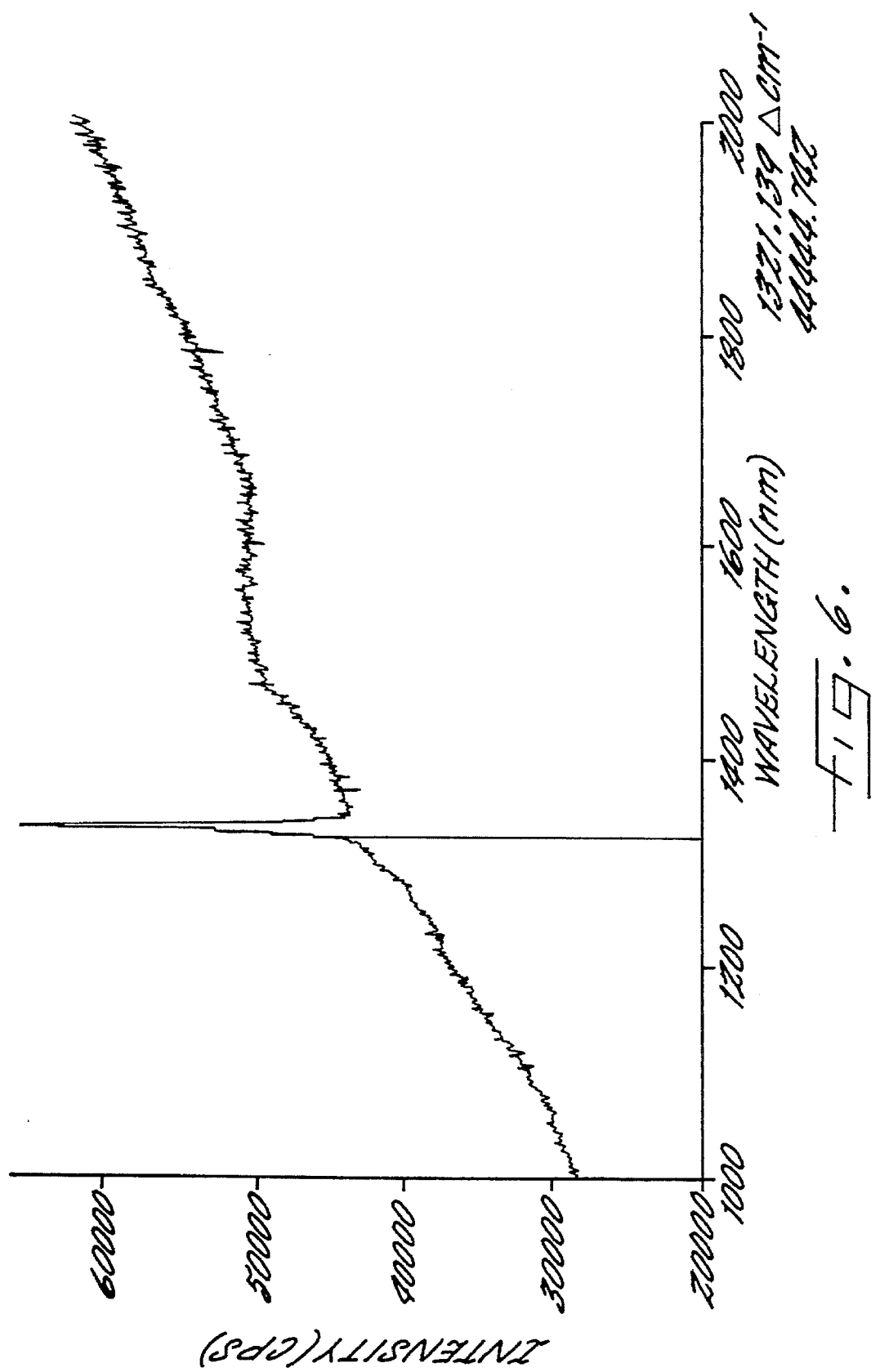
FIG. 6 is a typical Raman spectrum from the diamond as shown in FIGS. 5A and 5B.

The SEM micrographs of FIGS. 5A and 5B illustrate that a film has formed with the faceting typical of a polycrystalline diamond film. The Raman spectrum shows unequivocally that the film is largely diamond with little $sp^2$ component.

The method and structure disclosed herein may be used to fabricate oriented diamond films and single crystal diamond films for microelectronics applications. Additionally, the method and structures disclosed herein may be used for producing strongly adhering diamond films on metals, such as iron, chromium and magnesium, for example. The diamond coated metals may have beneficial uses and applications outside of the microelectronics field.

The method and structure disclosed herein may be used to fabricate oriented diamond films and single crystal diamond films for microelectronics applications. Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modification and embodiments are intended to be included within the scope of the appended claims.

That which is claimed is:

1. A semiconductor device comprising:
   a first layer comprising a transition metal;
   a second layer on the first layer, the second layer comprising a semiconducting oriented diamond wherein portions of said oriented diamond layer are in alignment with a lattice of corresponding portions of said first layer; and
   a metal silicide interface region between said first and second layers.

2. A semiconductor devices according to claim 1 wherein the metal silicide of the metal silicide interface region is a transition metal silicide.

3. A semiconductor device according to claim 2 wherein the transition metal of said transition metal silicide is selected from the group consisting of nickel, cobalt, copper, chromium, magnesium, iron, zinc and alloys thereof.

4. A semiconductor device according to claim 1 wherein said semiconducting oriented diamond is a single crystal diamond.

5. A semiconducting device according to claim 1 wherein said semiconducting diamond is highly oriented or polycrystalline diamond.

6. A semiconductor device according to claim 1 wherein said metal silicide is a refractory metal silicide.

7. A semiconductor device according to claim 6 wherein the refractory metal of the refractory metal silicide is selected from the group consisting of titanium, tantalum, tungsten, molybdenum, hafnium and niobium.

8. A semiconductor device comprising:
   a non-diamond substrate;
   a first layer on the non-diamond substrate, the first layer comprising a metal silicide; and
   a second layer on the first metal silicide layer, the second layer comprising a semiconducting oriented diamond wherein portions of said oriented diamond layer are in alignment with a lattice of corresponding portions of said non-diamond substrate.

9. A semiconductor device according to claim 8 wherein said metal silicide is a transition metal silicide.

10. A semiconductor device according to claim 9 wherein the transition metal of said transition metal silicide is selected from the group consisting of nickel, cobalt, copper, chromium, magnesium, iron, zinc and alloys thereof.

11. A semiconductor device according to claim 8 wherein said semiconducting oriented diamond is single crystal diamond film.

12. A semiconductor device according to claim 8 wherein the non-diamond substrate is selected from the group consisting of $Al_2O_3$, MgO, $SrTiO_3$, $ZrO_2$, BeO, $BaF_2$, $CaF_2$, SiC, GaAs, AlN, $SiO_2$, Si, $Si_3N_4$, $LaAlO_3$ and $LaGaO_3$.

13. A semiconducting device according to claim 8 wherein said semiconducting diamond is highly oriented or polycrystalline diamond.

14. A semiconductor device according to claim 8 wherein said metal silicide is a refractory metal silicide.

15. A semiconductor device according to claim 14 wherein the refractory metal of the refractory metal silicide is selected from the group consisting of titanium, tantalum, tungsten, molybdenum, hafnium and niobium.

* * * * *